United States Patent
Bodrozic et al.

(10) Patent No.: US 8,301,941 B2
(45) Date of Patent: Oct. 30, 2012

(54) MEMORY CONTROLLER WITH LOOPBACK TEST INTERFACE

(75) Inventors: Luka Bodrozic, San Francisco, CA (US); Sukalpa Biswas, Fremont, CA (US); Hao Chen, San Ramon, CA (US); Sridhar P. Subramanian, Cupertino, CA (US); James B. Keller, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/305,202

(22) Filed: Nov. 28, 2011

(65) Prior Publication Data

US 2012/0072787 A1    Mar. 22, 2012

Related U.S. Application Data

(63) Continuation of application No. 12/909,073, filed on Oct. 21, 2010, now Pat. No. 8,086,915, which is a continuation of application No. 11/760,566, filed on Jun. 8, 2007, now Pat. No. 7,836,372.

(51) Int. Cl.
*G01R 31/28* (2006.01)
*G11C 29/00* (2006.01)
*G06F 11/00* (2006.01)

(52) U.S. Cl. .................. 714/716; 714/718; 714/743

(58) Field of Classification Search .................. None
See application file for complete search history.

(56) References Cited

U.S. PATENT DOCUMENTS

| | | | |
|---|---|---|---|
| 3,599,160 A | 8/1971 | Nestle et al. | |
| 4,799,152 A | 1/1989 | Chuang et al. | |
| 4,858,116 A | 8/1989 | Gillett et al. | |
| 5,043,976 A | 8/1991 | Abiven et al. | |
| 5,161,162 A | 11/1992 | Watkins et al. | |
| 5,321,805 A | 6/1994 | Hayman et al. | |
| 5,392,302 A | 2/1995 | Kemp et al. | |
| 5,553,265 A | 9/1996 | Abato et al. | |
| 5,701,306 A | 12/1997 | Arai | |
| 5,812,472 A | 9/1998 | Lawrence et al. | |
| 6,016,525 A * | 1/2000 | Corrigan et al. | 710/100 |
| 6,374,372 B1 * | 4/2002 | Ha | 714/43 |
| 6,859,059 B2 | 2/2005 | Rohrbaugh et al. | |

(Continued)

OTHER PUBLICATIONS

Mark Hayter, "Zen and the Art of SOC Design," Microprocessor Summit 2006, Session MPS-960 High End Processors, P.A. Semi, Inc., 14 pages.

(Continued)

*Primary Examiner* — Ajay Bhatia
*Assistant Examiner* — Daniel McMahon
(74) *Attorney, Agent, or Firm* — Lawrence J. Merkel; Meyertons, Hood, Kivlin, Kowert & Goetzel, P.C.

(57) ABSTRACT

An apparatus may include an interconnect; at least one processor coupled to the interconnect; and at least one memory controller coupled to the interconnect. The memory controller may be programmable by the processor into a loopback test mode of operation and, in the loopback test mode, the memory controller may be configured to receive a first write operation from the processor over the interconnect. The memory controller may be configured to route write data from the first write operation through a plurality of drivers and receivers connected to a plurality of data pins that are capable of connection to one or more memory modules. The memory controller may be further configured to return the write data as read data on the interconnect for a first read operation received from the processor on the interconnect.

17 Claims, 3 Drawing Sheets

U.S. PATENT DOCUMENTS

| | | |
|---|---|---|
| 6,928,593 B1 | 8/2005 | Halbert et al. |
| 7,197,676 B2 | 3/2007 | Co et al. |
| 7,202,545 B2 | 4/2007 | Perner |
| 7,353,362 B2 | 4/2008 | Georgiou |
| 7,376,817 B2 | 5/2008 | Kadambi et al. |
| 7,676,639 B2 | 3/2010 | Barnum et al. |
| 7,983,112 B2 | 7/2011 | Haraguchi et al. |
| 2003/0120989 A1 | 6/2003 | Zumkehr |

OTHER PUBLICATIONS

James B. Keller, "The PWRficient Processor Family," PA Semi, Oct. 2005, 31 pages.

"PCI Express Base Specification," Revision 1.0a, Apr. 15, 2003, PCI Express, 6 pages.

\* cited by examiner

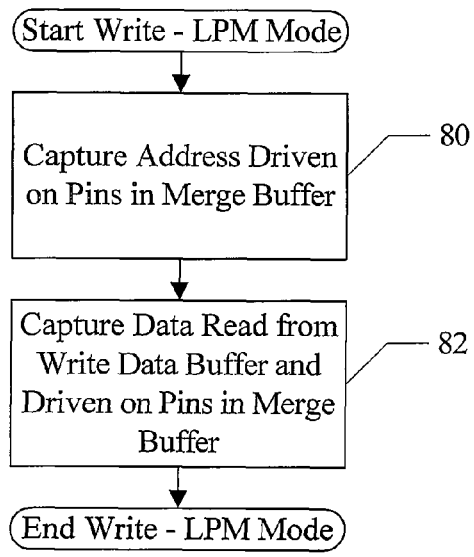
Fig. 3
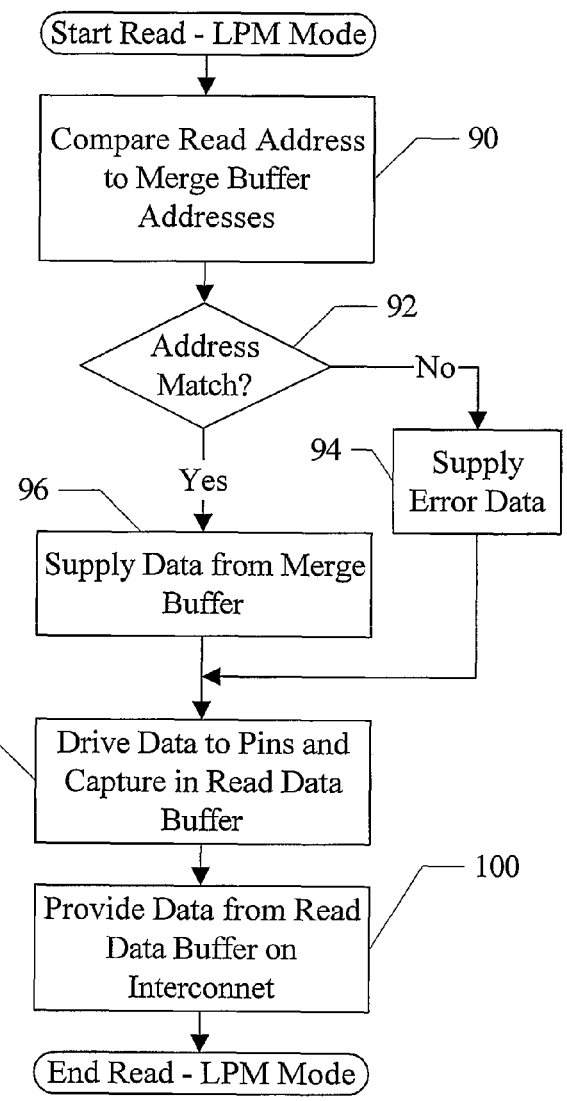
Fig. 4
Write LPM, CtlReg
Write Addr, TestData
Read Addr, DestReg
Compare TestData, DestReg
BNE ErrorTag
Modify Addr, TestData
B
Fig. 5

MEMORY CONTROLLER WITH LOOPBACK TEST INTERFACE

This application is a continuation of U.S. application Ser. No. 12/909,073, which was filed on Oct. 21, 2010 and is now U.S. Pat. No. 8,086,915, which is a continuation of U.S. application Ser. No. 11/760,566, which was filed on Jun. 8, 2007, now U.S. Pat. No. 7,836,372. These applications are incorporated herein by reference in their entireties.

BACKGROUND

1. Field of the Invention

This invention is related to the field of memory controllers and, more particularly, to loopback test functionality for memory controllers and integrated circuits including such memory controllers.

2. Description of the Related Art

As integrated circuits increase in complexity and in the number of transistors included on a given instance of the circuit, the testing capabilities of the circuit increase in importance. The ability to test the circuit with a high level of test coverage (to ensure that the circuit is not defective) and inexpensively is an important component of producing a high quality, affordable, and profitable integrated circuit product.

One mechanism that can be useful for testing on a symmetrical interface is loopback. A symmetrical interface is an interface that has the same protocol and physical attributes in both the transmit and receive directions. For example, the Peripheral Component Interconnect (PCI) Express (PCIe) interface is symmetrical. One or more lanes are configured into a link, and each lane comprises a transmit serial communication and a receive serial communication. Thus, a communication transmitted on the transmit link can fairly easily be returned (or "looped back") on the receive link. Other interfaces that use loopback testing include Ethernet, for example. Loopback testing allows at-speed, functional test of the interface hardware, all the way to the integrated circuit pins and back. Accordingly, both the functional circuitry and the entire transmission path within the integrated circuit can be tested using loopback. Additionally, the test can be performed inexpensively by coupling the output to the input (possibly with delay for timing purposes and/or minor processing to meet protocol requirements) or coupling a component to the interface, rather than using an expensive at-speed tester.

A memory interface, from a memory controller to one or more memory modules such as Dual-Inline Memory Modules (DIMMs), is not symmetrical. Typically, a unidirectional address/command and address control (row address strobe (RAS), column address strobe (CAS), etc.) interface is provided from the memory controller to the memory modules. A bidirectional data bus and data control (e.g. DQ signals) interface is provided, which flows from the memory controller to the memory modules for a write operation and from the memory modules to the memory controller for a read operation. Accordingly, there is not a natural way to perform loopback testing on the memory interface, to test the memory controller hardware. Typically, expensive tester equipment is used to test the memory controller, increasing the cost of the product.

SUMMARY

In one embodiment, an apparatus comprises an interconnect; at least one processor coupled to the interconnect; and at least one memory controller coupled to the interconnect. The memory controller is programmable by the processor into a loopback test mode of operation. In the loopback test mode, the memory controller is configured to receive a first write operation from the processor over the interconnect. The memory controller is configured to route write data from the first write operation through a plurality of drivers and receivers connected to a plurality of data pins that are capable of connection to one or more memory modules. The memory controller is further configured to return the write data as read data on the interconnect for a first read operation received from the processor on the interconnect. In one embodiment, the read data is driven through the drivers and receivers as well, before being returned on the interconnect.

In an embodiment, the memory controller comprises a write data buffer, the plurality of drivers, the plurality of receivers, and a controller. The write data buffer is configured to store write data received from one or more write operations on an interconnect to which the memory controller is coupled. The controller is configured, in a loopback test mode of operation, to cause first write data to be transmitted from the write data buffer, through the plurality of drivers and the plurality of receivers, to be recaptured by the memory controller in response to a first write operation.

In one embodiment, a method comprises issuing a first write operation from a processor to a memory controller in a loopback test mode of operation; routing write data from the first write operation through a plurality of drivers and receivers in the memory controller, wherein the plurality of drivers and receivers are connected to a plurality of data pins that are capable of connection to one or more memory modules; issuing a first read operation from the processor to the memory controller in the loopback test mode of operation; and returning the write data as read data on the interconnect for a first read operation received from the processor on the interconnect. In one embodiment, the read data is driven through the plurality of drivers and receivers as well.

BRIEF DESCRIPTION OF THE DRAWINGS

The following detailed description makes reference to the accompanying drawings, which are now briefly described.

FIG. 3 is a flowchart illustrating operation of a write in loopback test mode for one embodiment.

FIG. 4 is a flowchart illustrating operation of a read in loopback test mode for one embodiment.

FIG. 5 is a diagram illustrating pseudocode corresponding to code that is executed on a processor shown in FIG. 1 for one embodiment.

Figure 1:
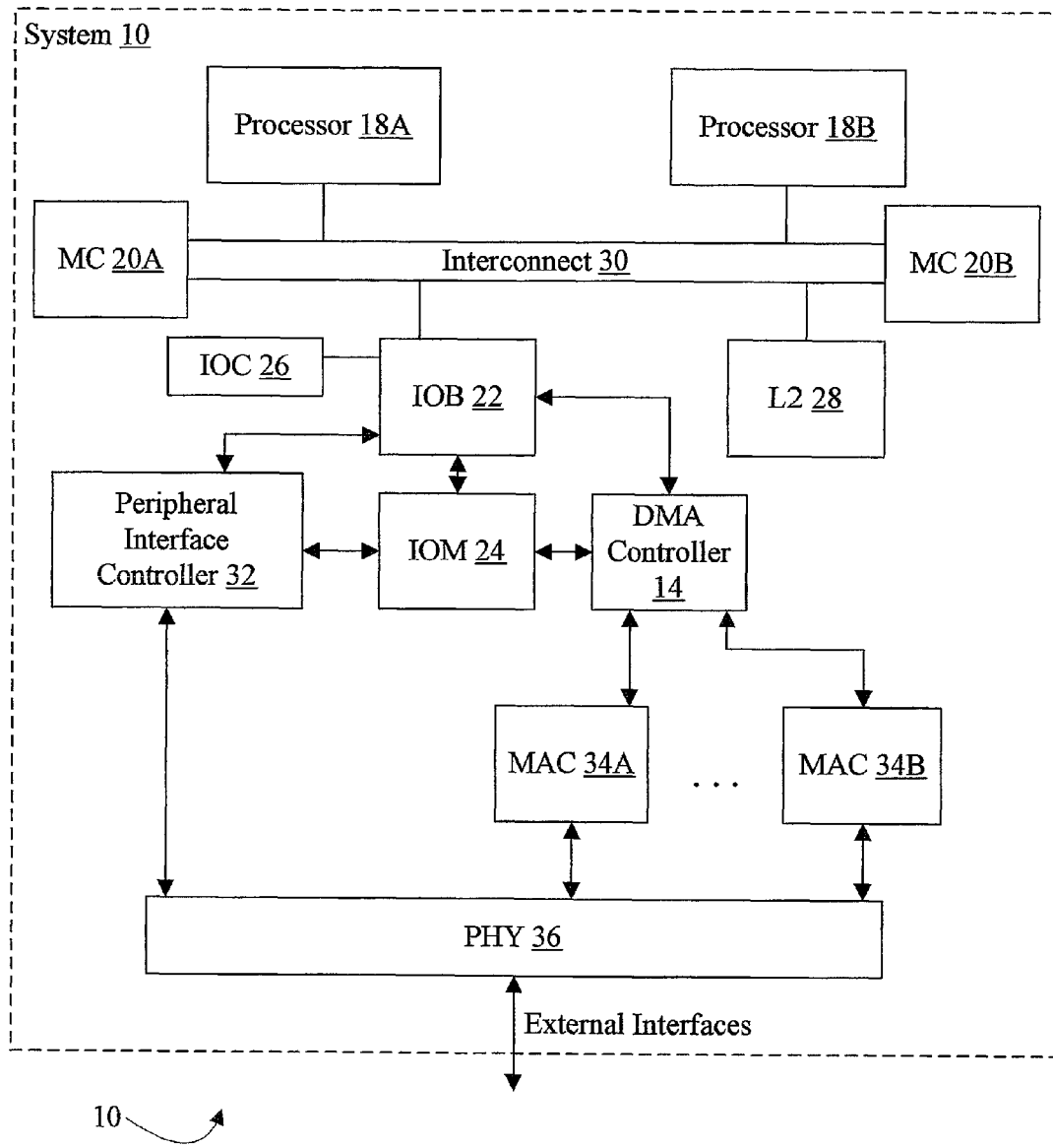
FIG. 1 is a block diagram of one embodiment of a system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Overview

Turning now to FIG. 1, a block diagram of one embodiment of a system 10 is shown. In the illustrated embodiment, the system 10 includes a DMA controller 14, one or more processors such as processors 18A-18B, one or more memory controllers such as memory controllers 20A-20B, an I/O bridge (IOB) 22, an I/O memory (IOM) 24, an I/O cache (IOC) 26, a level 2 (L2) cache 28, an interconnect 30, a peripheral interface controller 32, one or more media access control circuits (MACs) such as MACs 34A-34B, and a physical interface layer (PHY) 36.

The processors 18A-18B, memory controllers 20A-20B, IOB 22, and L2 cache 28 are coupled to the interconnect 30. The IOB 22 is further coupled to the IOC 26 and the IOM 24. The DMA controller 14 is also coupled to the IOB 22 and the IOM 24. The MACs 34A-34B are coupled to the DMA controller 14 and to the physical interface layer 36. The peripheral interface controller 32 is also coupled to the I/O bridge 22 and the I/O memory 34 and to the physical interface layer 36. In some embodiments, the components of the system 10 may be integrated onto a single integrated circuit as a system on a chip. In other embodiments, the system 10 may be implemented as two or more integrated circuits.

The DMA controller 14 is configured to perform DMA transfers between the interface circuits 16 and the host address space. Additionally, the DMA controller 14 may, in some embodiments, be configured to perform DMA transfers between sets of memory locations within the address space (referred to as a "copy DMA transfer").

The DMA controller 14 may also be configured to perform one or more operations (or "functions") on the DMA data as the DMA data is being transferred, in some embodiments. In one embodiment, some of the operations that the DMA controller 14 performs are operations on packet data (e.g. encryption/decryption, cyclical redundancy check (CRC) generation or checking, checksum generation or checking, etc.). The operations may also include an exclusive OR (XOR) operation, which may be used for redundant array of inexpensive disks (RAID) processing, for example.

The processors 18A-18B comprise circuitry to execute instructions defined in an instruction set architecture implemented by the processors 18A-18B. Specifically, one or more programs comprising the instructions may be executed by the processors 18A-18B. Any instruction set architecture may be implemented in various embodiments. For example, the PowerPC™ instruction set architecture may be implemented. Other exemplary instruction set architectures may include the ARM™ instruction set, the MIPS™ instruction set, the SPARC™ instruction set, the x86 instruction set (also referred to as IA-32), the IA-64 instruction set, etc.

The memory controllers 20A-20B comprise circuitry configured to interface to memory. For example, the memory controllers 20A-20B may be configured to interface to dynamic random access memory (DRAM) such as synchronous DRAM (SDRAM), double data rate (DDR) SDRAM, DDR2 SDRAM, Rambus DRAM (RDRAM), etc. The memory controllers 20A-20B may receive read and write operations for the memory to which they are coupled from the interconnect 30, and may perform the read/write operations to the memory. Specifically, the memory controllers 20A-20B may be configured to interface to one or more DRAM memory modules. A memory module may generally comprise two or more memory chips attached to a printed circuit board that can be inserted into a memory module slot on another printed circuit board to which the memory controllers 20A-20B are coupled. Each memory controller 20A-20B may be coupled to one or more memory module slots on the board, and each memory module slot may be coupled to only one memory controller 20A-20B. The memory module may also include other memory circuitry, such as the advanced memory buffer (AMB) included in fully buffered DIMMs. Memory modules may include DIMMs, single inline memory modules (SIMMs), etc.

The L2 cache 28 may comprise a cache memory configured to cache copies of data corresponding to various memory locations in the memories to which the memory controllers 20A-20B are coupled, for low latency access by the processors 18A-18B and/or other agents on the interconnect 30. The L2 cache 28 may comprise any capacity and configuration (e.g. direct mapped, set associative, etc.).

The IOB 22 comprises circuitry configured to communicate transactions on the interconnect 30 on behalf of the DMA controller 14 and the peripheral interface controller 32. The interconnect 30 may support cache coherency, and the IOB 22 may participate in the coherency and ensure coherency of transactions initiated by the IOB 22. In the illustrated embodiment, the IOB 22 employs the IOC 26 to cache recent transactions initiated by the IOB 22. The IOC 26 may have any capacity and configuration, in various embodiments, and may be coherent. The IOC 26 may be used, e.g., to cache blocks of data which are only partially updated due to reads/writes generated by the DMA controller 14 and the peripheral interface controller 32. Using the IOC 26, read-modify-write sequences may be avoided on the interconnect 30, in some cases. Additionally, transactions on the interconnect 30 may be avoided for a cache hit in the IOC 26 for a read/write generated by the DMA controller 14 or the peripheral interface controller 32 if the IOC 26 has sufficient ownership of the cache block to complete the read/write. Other embodiments may not include the IOC 26.

The IOM 24 may be used as a staging buffer for data being transferred between the IOB 22 and the peripheral interface controller 32 or the DMA controller 14. Thus, the data path between the IOB 22 and the DMA controller 14/peripheral interface controller 32 may be through the IOM 24. The control path (including read/write requests, addresses in the host address space associated with the requests, etc.) may be between the IOB 22 and the DMA controller 14/peripheral interface controller 32 directly. The IOM 24 may not be included in other embodiments.

The interconnect 30 may comprise any communication medium for communicating among the processors 18A-18B, the memory controllers 20A-20B, the L2 cache 28, and the IOB 22. For example, the interconnect 30 may be a bus with coherency support. The interconnect 30 may alternatively be a point-to-point interconnect between the above agents, a packet-based interconnect, or any other interconnect. The interconnect may be coherent, and the protocol for supporting coherency may vary depending on the interconnect type. In one embodiment, the address interconnect may be a broadcast address bus (with staging to absorb one or more clock cycles of transmit latency). A partial crossbar data interconnect may be implemented for data transmission.

The MACs 34A-34B may comprise circuitry implementing the media access controller functionality defined for network interfaces. For example, one or more of the MACs 34A-34B may implement the Gigabit Ethernet standard. One or more of the MACs 34A-34B may implement the 10 Gigabit Ethernet Attachment Unit Interface (XAUI) standard. Other embodiments may implement other Ethernet standards, such as the 10 Megabit or 100 Megabit standards, or any other network standard. In one implementation, there are 6 MACs, 4 of which are Gigabit Ethernet MACs and 2 of which are XAUI MACs. Other embodiments may have more or fewer MACs, and any mix of MAC types.

Among other things, the MACs 34A-34B that implement Ethernet standards may strip off the inter-frame gap (IFG), the preamble, and the start of frame delimiter (SFD) from received packets and may provide the remaining packet data to the DMA controller 14 for DMA to memory. The MACs 34A-34D may be configured to insert the IFG, preamble, and SFD for packets received from the DMA controller 14 as a transmit DMA transfer, and may transmit the packets to the PHY 36 for transmission.

The peripheral interface controller 32 comprises circuitry configured to control a peripheral interface. In one embodiment, the peripheral interface controller 32 may control a peripheral component interconnect (PCI) Express interface. Other embodiments may implement other peripheral interfaces (e.g. PCI, PCI-X, universal serial bus (USB), etc.) in addition to or instead of the PCI Express interface.

The PHY 36 may generally comprise the circuitry configured to physically communicate on the external interfaces to the system 10 under the control of the interface circuits 16. In one particular embodiment, the PHY 36 may comprise a set of serializer/deserializer (SERDES) circuits that may be configured for use as PCI Express lanes or as Ethernet connections. The PHY 36 may include the circuitry that performs 8b/10b encoding/decoding for transmission through the SERDES and synchronization first-in, first-out (FIFO) buffers, and also the circuitry that logically configures the SERDES links for use as PCI Express or Ethernet communication links. In one implementation, the PHY may comprise 24 SERDES that can be configured as PCI Express lanes or Ethernet connections. Any desired number of SERDES may be configured as PCI Express and any desired number may be configured as Ethernet connections.

It is noted that, in various embodiments, the system 10 may include one or any number of any of the elements shown in FIG. 1 (e.g. processors, memory controllers, caches, I/O bridges, DMA controllers, and/or interface circuits, etc.).

Memory Controller with Loopback Testing

The memory controllers 20A-20B may be designed to perform loopback testing on the memory interface. Thus, the memory controller functionality may be tested at speed using loopback operation, and may be performed relatively inexpensively, in some embodiments.

In one embodiment, in a loopback mode of operation, data from a write operation may be looped back into a data buffer in the memory controller 20A-20B. A subsequent read operation to the same address as the write operation may cause the memory controller 20A-20B to return the data from the data buffer. The read and write data may be compared to determine that proper operation was observed. For example, in one embodiment, one of the processors 18A-18B may execute a program including one or more instructions that generate the write operation and the read operation, when executed. The program may also include instructions to compare the read data to the write data to detect an error (and thus detect that the test fails).

The loopback test mode may additionally include looping back the address information to a buffer or queue. The write address may be captured in this fashion, and may be compared to read addresses to detect that data is to be returned. Multiple write operations may be performed before a corresponding set of read operations, if desired, using the comparison to discern which write data to return for each read operation. Alternatively, the memory controller 20A may be preconfigured with addresses that are to be read and written during the test. The looped-back address information may be compared to the preconfigured addresses to capture/supply data for write/read operations.

If a read operation occurs in loopback test mode and no data is detected for the read (e.g. because there is an error in the address path that results in an incorrect address being captured for comparison), the memory controller 20A-20B may return error data for the read. The error data may be any data that results in an error being detected. For example, the error data may simply be different that the data in the read data buffer 42 (e.g. the data may be inverted and returned). Alternatively, any random data may be returned, or all zeros may be returned. Data with erroneous ECC may be returned, if the interconnect 30 supports ECC. If the interconnect 30 permits returning an error status instead of data, the error data may comprise the error status.

By exercising various combinations of binary ones and zeros for the addresses and data in the read/write operations used during loopback test mode, relatively high levels of test coverage may be achieved. Patterns of address and data may be selected from any of a number of test patterns (e.g. an alternating ones and zeros pattern and the inverse of the pattern, etc.).

Figure 2:
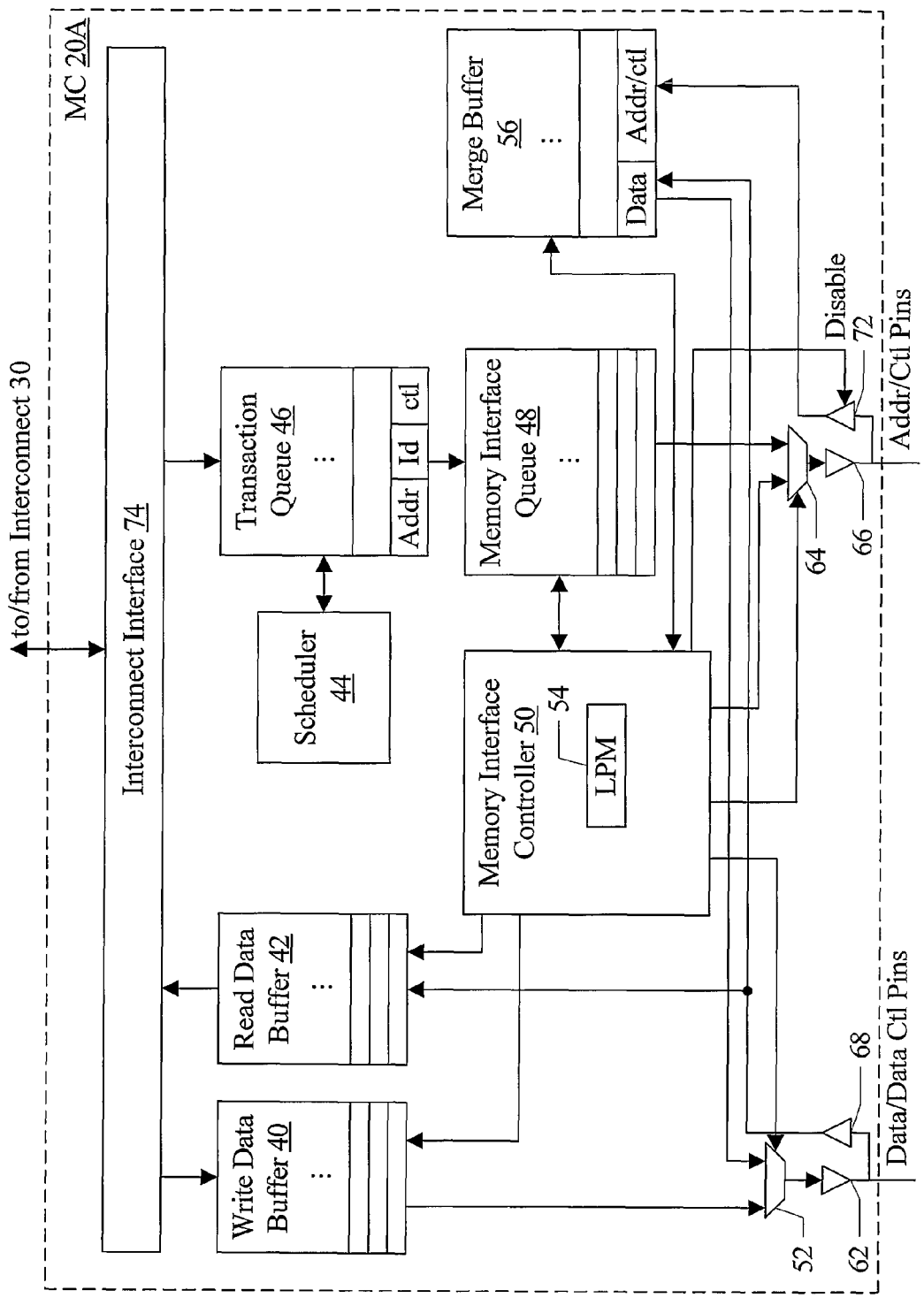
FIG. 2 is a block diagram of one embodiment of a memory controller shown in FIG. 1.

Turning now to FIG. 2, a block diagram of one embodiment of the memory controller 20A is shown. The memory controller 20B may be similar. In the illustrated embodiment, the memory controller 20A includes an interconnect interface circuit 74, a write data buffer 40, a read data buffer 42, a scheduler 44, a transaction queue 46, a memory interface queue 48, a memory interface controller 50 that includes a loopback mode bit (LPM) in a control register 54, a merge buffer 56, muxes 52 and 64, drivers 62 and 66, and receivers 68 and 72. The interconnect interface circuit 74 is coupled to the interconnect 30 and to the write data buffer 40, the read data buffer 42, and the transaction queue 46. The scheduler 44 is coupled to the transaction queue 46, which is coupled to the memory interface queue 48. The memory interface queue 48 is coupled to the memory interface controller 50 and to the mux 64, the output of which is coupled to the drivers 66. The drivers 66 are coupled to a plurality of address and control pins (Addr/Ctl Pins) to which one or more memory modules are capable of being coupled. The address pins are further coupled to the receivers 72, which are coupled to receive a disable input from the memory interface controller 50 and are coupled to the merge buffer 56. The memory interface controller 50 is also coupled to the merge buffer 56, the read data buffer 42, the write data buffer 40, and the muxes 52 and 64. Specifically, the memory interface controller 50 is coupled to provide an input to the mux 64 as well as a selection control to the mux 64. The memory interface controller 50 is coupled to provide mux control to the mux 52 also. The write data buffer 40 is coupled to the mux 52 as an input. The mux 52 output is coupled to the drivers 62, and the other input of the mux 52 is coupled to the merge buffer 56. The drivers 62 are coupled to a plurality of data and data control pins (Data/Data Ctl Pins), which are also coupled to the receivers 68, which are coupled to the read data buffer 42 and the merge buffer 56.

The interconnect interface circuit 74 includes the circuitry for interfacing to the interconnect 30, using appropriate protocol, timing, physical signalling, etc. The interconnect interface circuit 74 may further include circuitry for decoding the address of a transaction on the interconnect 30, to detect read or write operations that are targeted at memory locations controlled by the memory controller 20A. That is, the interconnect interface circuit 74 may be programmable with one or more memory address ranges that are mapped to the memory controller 20A. The interconnect interface circuit 74 may include buffering for timing/pipelining reasons, but may generally use the write data buffer 40, the read data buffer 42, and the transaction queue 46 for storage, in one embodiment.

In a normal mode of operation (i.e. non-test mode), the interconnect interface circuit 74 may decode the address of a transaction transmitted on the interconnect 30, and may detect a read or write operation mapped to the memory controller 20A. The interconnect interface circuit 74 may write the address portion of the operation to the transaction queue 46. The transaction queue 46 may comprise a plurality of entries for storing address information for read/write operations. For example, an entry may include an address field (Addr), an identifier (Id) field, and a control (ctl) field. The address field may store the address bits (or at least enough of the address bits to address the memory modules to which the memory controller 20A may be coupled in normal operation). The Id field may store the identifier transmitted on the interconnect 30, which may identify the source of the operation and may also include a sequence number or other tag assigned by the source. The control field may store various control information for the operation (e.g. valid bit, size of the operation, read or write, etc.).

The scheduler 44 may schedule operations from the transaction queue 46 according to any scheduling criteria. For example, ordering rules may be enforced by the scheduler 44. The scheduler 44 may also attempt to opportunistically schedule operations that are to the same memory page (and thus can be performed with lower latency "page mode" accesses), if possible. Scheduled operations are read from the transaction queue 46 and written to the memory interface queue 48, which may comprise a plurality of entries for scheduled operations. The memory interface controller 50 may schedule operations from the memory interface queue 48 and may drive the address control signals on the memory interface, through the mux 64 and the drivers 66. The address bits may be read from the memory interface queue 48 and may be driven through the mux 64 and on the pins via the drivers 66. In another embodiment, both address and control may be read from the memory interface queue 48 and provided through the mux 64 to the drivers 66.

If the operation is a write, the write data may be received from the interconnect interface circuit 74 and may be written to the write data buffer 40. The memory interface controller 50 may read the write data from the write data buffer 40 for transmission to the memory modules. Data from the write data buffer 40 is driven through the mux 52 and then by the drivers 62 onto the data pins. For cache block sized writes, the complete write data may be transmitted as several "beats" over the data pins. The write data buffer 40 may comprise a plurality of entries. Each entry may store data for one write operation, and thus multiple write operations may have data in the write data buffer 40 at the same time.

If the operation is a read, the data is received by the receivers 68 and is captured in the read data buffer 42, and then may be transferred from the read data buffer 42 onto the interconnect 30. The read data buffer 42 may comprise a plurality of entries. Each entry may store data for one read operation, and thus multiple read operations may have data in the read data buffer 42 at the same time.

For non-cache block sized write operations, if the size of the operation is not a multiple of the data beat size on the data pins, a read-modify-write operation may be performed. A read-modify-write operation comprises reading the memory data, modifying the read data with the write data, and writing the modified data back to memory. If the memory includes error correction code (ECC) protection, ECC data may be generated for the modified data and the new ECC data may be written back with the modified data. The merge buffer 56 may be used to support the read-modify-write operation. As part of the read, the address of the operation may be written to the merge buffer 56. The address may be provided from the transaction queue 46 in parallel with writing it to the memory interface queue 48, or may be provided by the memory interface queue 48 (separate from the path through the drivers and receivers shown in FIG. 2). The read data from the read portion of the read-modify-write is also provided, and is stored in the merge buffer 56. In other embodiments, only the data may be stored in the merge buffer 56 and the address may be retained in the memory interface queue 48. Subsequently, the write portion of the read-modify-write may be performed. During the write, data from the merge buffer 56 may be provided to the mux 52 as well as the write data from the write data buffer 40. If a given byte is being written, the mux 52 may select the byte from the write data buffer 40. Otherwise, the read data from the merge buffer 56 is selected for that byte. If the address is also provided from the merge buffer 56, the address may be muxed into the address path from the memory interface queue 48 to the drivers 66, or the address may be routed through the memory interface queue 48 from the merge buffer 56. However, in some embodiments, the memory interface queue 48 may retain the address for a read-modify-write operation and may retransmit the address for the write portion of the operation. The merge buffer 56 may comprise a plurality of entries and thus may support multiple read-modify-write operations outstanding at one time.

To support the loopback test mode, the receivers 72 are provided. If the loopback test mode were not implemented, the receivers 72 would not be needed, since the address and address control pins are unidirectional in normal mode, from the memory controller 20A to the memory modules. In the illustrated embodiment, the receivers 72 may include a disable input, and the memory interface controller 50 may disable the receivers 72 during normal mode.

The memory interface controller 50 may be programmable into the loopback test mode (e.g. by software setting the LPM bit in the register 54, in one embodiment). In this embodiment, the loopback test mode control logic may be implemented in the memory interface controller 50. If loopback test mode is enabled, the memory interface controller 50 may enable the receivers 72.

FIG. 3 is a flowchart illustrating additional operation for one embodiment of a write operation in the loopback test mode. Blocks are shown in FIG. 3 in a particular order for ease of understanding, but other orders may be used. Blocks may be performed in parallel in combinatorial logic in the memory interface controller 50 and/or may be pipelined over multiple clock cycles as desired.

A write operation received in loopback test mode may initially be processed similar to a write operation in normal mode. That is, the address information received from the interconnect 30 may be written to the transaction queue 46 and the data received from the interconnect 30 may be written to the write data buffer 40. The scheduler 44 may schedule the write operation, and the scheduled write operation may be written to the memory interface queue 48. The memory interface controller 50 may schedule the write operation from the memory interface queue 48. The address and control signals may be driven to the address/control pins by the drivers 66. Additionally, the address bits and control signals may be received by the receivers 72, which may provide the address bits and control signals to the merge buffer 56. The memory interface controller 50 may write the address and control information to the merge buffer 56 (block 80). Alternatively, in embodiments in which the addresses are preconfigured in the memory controller 20A, the address may be routed to the merge buffer 56 (through the drivers 66 and receivers 72) may be compared to the addresses to select a merge buffer entry to store the write data. If no matching address is detected (which may indicate an error in the address transmission path), then the write data may not be stored.

For DRAMs, the address may be transmitted in two transmissions over the address pins, with different controls (the row address and the column address). Thus, capturing the address in the merge buffer 56 may similarly include two captures of address bits. Comparing the address may include two comparisons. It is noted that, in the loopback test mode, there may not be (and need not be) any actual memory attached to the memory controller pins. The loopback test may be performed on the system 10 in isolation, on the system 10 mounted on a test board without any memory, etc.

The write data may be read from the write data buffer 40 and transmitted, through the drivers 62, onto the data pins. Additionally, the data may flow through the receivers 68, and the memory interface controller 50 may cause the merge buffer 56 to capture the data (block 82). As mentioned previously, the data may be driven as multiple beats over the data pins. Accordingly, the data may be captured as multiple beats as well. Such operation is similar to receiving read data in multiple beats in normal mode. Alternatively, in another embodiment, the data may be captured into the read data buffer 42. The data may be provided from the read data buffer for a subsequent read to the same address.

Accordingly, when the write operation completes in loopback mode, the write address and data of the write operation is in an entry of the merge buffer 56 in the present embodiment. Alternatively, in embodiments that store only data in the merge buffer 56, the addresses may be stored in control registers that can be written with the expected addresses before the write operation(s) are issued.

FIG. 4 is a flowchart illustrating additional operation for one embodiment of a read operation in the loopback test mode. Blocks are shown in FIG. 4 in a particular order for ease of understanding, but other orders may be used. Blocks may be performed in parallel in combinatorial logic in the memory interface controller 50 and/or may be pipelined over multiple clock cycles as desired.

A read operation in the loopback test mode may initially be processed similar to a read operation in the normal mode. The read operation may be received from the interconnect 30 by the interconnect interface 74 and may be written to the transaction queue 46. The scheduler 44 may schedule the read operation, and the scheduled read operation may be written to the memory interface queue 48. The memory interface controller 50 may schedule the read operation from the memory interface queue 48. The read address may be driven through the drivers 66 to the address pins, and through the receivers 72 to the merge buffer 56. The read address may be compared to the address in the merge buffer 56 (or the corresponding control registers) (block 90). If the read address does not match a write address in the merge buffer 56 (decision block 92, "no" leg), the memory interface controller 50 may cause error data to be supplied for the read (block 94). If the read address matches a write address in the merge buffer 56 (decision block 92, "yes" leg), the memory interface controller 50 may cause the data from the associated entry of the merge buffer 56 to be supplied (block 96). The supplied data (error data or from the merge buffer) may then be transmitted through the mux 52, the drivers 62, and the receivers 68. The data may be captured by the read data buffer 42 (block 98) to be supplied on the interconnect 30 (block 100).

It is noted that each of drivers 62 and 66 may represent a plurality of drivers, one for each pin to which the drivers are connected. The drivers may drive different bits/signals, in parallel. Similarly, each of the receivers 68 and 72 may represent a plurality of receivers, each coupled to a different pin.

It is further noted that, in some embodiments, first-in, first-out buffers may be provided on the read data path and/or the write data path to cross the clock domain boundary from the interconnect 30 to the clock domain corresponding to the memory interface/memory modules.

FIG. 5 is a diagram illustrating pseudocode representing instructions that may be executed by a processor 18A-18B to perform a loopback test of a memory controller 20A-20B for one embodiment. The actual instructions, and number of instructions, may differ from the pseudocode. The processor 18A-18B may execute instructions to write the LPM bit in the control register 54 (Write LPM, CtlReg), to write an address with test data (Write Addr, TestData), to read data from the address to a destination register (Read Addr, DestReg), to compare the test data with the destination register (Compare TestData, DestReg), to branch if the test data is not equal to the destination register to an error handling routine (BNE ErrorTag), to modify one or both of the address and the test data (Modify Addr, TestData), and to branch back to the write operation (B). As noted previously, multiple write operations followed by multiple read operations may be performed, up to the number of operations that can be concurrently queued in the merge buffer 56. The branch at the end may be conditional branch based on a loop count or other variable, and then the loopback test may exit (e.g. writing the control register 54 to clear the LPM bit). In some embodiments, the write of the LPM bit may be preceded by writes that preconfigured the test addresses into control registers in the memory controller 20A that correspond to each merge buffer entry.

Numerous variations and modifications will become apparent to those skilled in the art once the above disclosure is fully appreciated. It is intended that the following claims be interpreted to embrace all such variations and modifications.

What is claimed is:

1. A memory controller comprising:
a write data buffer configured to store write data received from one or more write operations on an interconnect to which the memory controller is coupled, wherein the one or more write operations are sourced by one or more processors coupled to the interconnect;
a plurality of drivers configured to drive first write data corresponding to a first write operation from the write data buffer to one or more memory modules that are capable of being coupled to the memory controller;
a plurality of receivers configured to receive data from the one or more memory modules when the one or more memory modules are coupled to the memory controller during use, wherein each of the plurality of receivers is coupled to the respective one of the plurality of drivers;
a first buffer;
a controller that, in a loopback test mode of operation and in response to the first write operation, is configured to cause the first write data corresponding to the first write operation to be transmitted from the write data buffer through the plurality of drivers and the plurality of receivers, wherein the first write data is captured from the plurality of receivers in the first buffer, and wherein, in response to a first read operation sourced by the one or more processors and in response to a match in a comparison of a read address from the first read operation to addresses in the first buffer, the controller is configured to cause the first write data from the first buffer to be transmitted on the interconnect in response to the first read operation;
a second plurality of drivers; and
a second plurality of receivers, wherein the second plurality of drivers are configured to drive address bits to the one or more memory modules, and wherein the second plurality of receivers are configured to provide the address bits to the first buffer for storage in the loopback test mode, whereby a write address of the first write operation is stored in the first buffer in the loopback test mode after being driven through the second plurality of drivers and the second plurality of receivers.

2. The memory controller as recited in claim 1 wherein, if the read address does not match an address in the first buffer, the controller is configured to cause error data to be returned on the interconnect in response to the first read operation.

3. The memory controller as recited in claim 1 wherein the read address is driven through the second plurality of drivers and the second plurality of receivers, and wherein the second plurality of receivers are configured to provide address bits from the read address for comparison to addresses in the first buffer to detect a buffer entry to supply data.

4. The memory controller as recited in claim 3 wherein the second plurality of receivers comprise a disable input, and wherein the controller is configured to disable the second plurality of receivers when not in the loopback test mode of operation.

5. The memory controller as recited in claim 3 further comprising a read data buffer configured to buffer read data in response to read operations prior to the read data being transmitted on the interconnect, and wherein the controller is configured, in the loopback test mode of operation, to cause the first write data from the first buffer to be transmitted through the plurality of drivers and the plurality of receivers to the read data buffer.

6. The memory controller as recited in claim 5 wherein the read data is supplied on the interconnect for the first read operation from the read data buffer.

7. An apparatus comprising:
an interconnect;
a processor coupled to the interconnect; and
a memory controller coupled to the interconnect, wherein the memory controller is programmable by the processor into a loopback test mode of operation, and wherein, in the loopback test mode, the memory controller is configured to receive a first write operation from the processor over the interconnect, and wherein the memory controller is configured to route write data from the first write operation through a plurality of drivers and a plurality of receivers configured to couple to one or more memory modules controlled by the memory controller during use, and wherein the memory controller is configured to capture the write data from the plurality of receivers in a first buffer, and wherein the memory controller is configured to return the captured write data as read data on the interconnect for a first read operation received from the processor on the interconnect, wherein the memory controller further comprises a read data buffer, and wherein data returned from the memory controller in response to the first read operation is routed by the memory controller from the first buffer through the plurality of drivers and receivers to the read data buffer, and wherein the memory controller is configured to drive the data from the read data buffer onto the interconnect, wherein a read address from the first read operation is compared to addresses of the write data in the first buffer to determine which data to provide to the read data buffer in response to the first read operation, wherein the memory controller further comprises a second plurality of drivers and a second plurality of receivers, wherein the second plurality of drivers are configured to drive address bits to the one or more memory modules, and wherein the second plurality of receivers are configured to provide address bits to the first buffer in the loopback test mode.

8. The apparatus as recited in claim 7 wherein the processor is configured to execute a program during the loopback test mode that includes instructions which, when executed, cause the first write operation and the first read operation.

9. The apparatus as recited in claim 8 wherein the program further includes one or more instructions which check that the read data matches the write data.

10. The apparatus as recited in claim 7 wherein the second plurality of receivers comprise a disable input, and wherein the memory controller is configured to disable the second plurality of receivers when not in the loopback test mode of operation.

11. The apparatus as recited in claim 7 wherein, if the read address does not match an address in the first buffer, the memory controller is configured to return error data in response to the first read operation.

12. The apparatus as recited in claim 7 further comprising a second memory controller coupled to the processor, the second memory controller programmable by the processor into the loopback test mode of operation, and wherein, in the loopback test mode, the second memory controller is configured to receive a second write operation from the processor over the interconnect, and wherein the second memory controller is configured to route second write data from the second write operation through a third plurality of drivers and a third plurality of receivers configured to couple to one or more second memory modules controlled by the second memory controller during use, and wherein the second memory controller is configured to capture the second write data from the third plurality of receivers in a second buffer, and wherein the memory controller is configured to return the captured second write data as second read data on the interconnect for a second read operation received from the processor on the interconnect, wherein the second memory controller further comprises a second read data buffer, and wherein second read data returned from the second memory controller in response to the second read operation is routed by the second memory controller from the second buffer through the third plurality of drivers and the third plurality of receivers to the second read data buffer, and wherein the second memory controller is configured to drive the second read data from the second read data buffer onto the interconnect.

13. A method comprising:
receiving a first write operation from a processor over an interconnect to a memory controller in a loopback test mode of operation;
routing write data from the first write operation through a plurality of drivers and a plurality of receivers in the memory controller, wherein the plurality of drivers and the plurality of receivers are configured to couple to one or more memory modules;
capturing the write data from the plurality of receivers in the memory controller as captured data in a first buffer;
receiving a first read operation from the processor over the interconnect to the memory controller in the loopback test mode of operation;
returning the captured data as read data on the interconnect for the first read operation received from the processor on the interconnect, wherein the returning comprises reading the captured data from the first buffer and transmitting the captured data through the plurality of drivers and the plurality of receivers prior to returning the captured data to on the interconnect, wherein the memory controller further comprises a second plurality of drivers and a second plurality of receivers, wherein the second plurality of drivers are configured to drive address bits to the one or more memory modules, and wherein the second plurality of receivers are configured to provide address bits to the first buffer; and comparing address bits from the second plurality of receivers to addresses in the first buffer.

14. The method as recited in claim 13 further comprising checking that the read data matches the write data in the processor.

15. The method as recited in claim 13 further comprising determining which of a plurality of buffer entries in the first buffer stores the write data responsive to the comparing.

16. The method as recited in claim 13 further comprising determining which of a plurality of buffer entries in the first buffer is to be updated with the write data responsive to the comparing.

17. The method as recited in claim 13 further comprising disabling the second plurality of receivers when not in the loopback test mode of operation.

* * * * *